United States Patent

Nevill et al.

[11] Patent Number: 6,115,835
[45] Date of Patent: *Sep. 5, 2000

[54] METHOD AND APPARATUS FOR DETERMINING A SET OF TESTS FOR INTEGRATED CIRCUIT TESTING

[75] Inventors: Leland R. Nevill; Than Huu Nguyen, both of Boise; Bruce J. Ford, Jr., Meridian; Gregory A. Barnett, Boise, all of Id.

[73] Assignee: Micron Technology, Inc., Boise, Id.

[*] Notice: This patent is subject to a terminal disclaimer.

[21] Appl. No.: 09/364,078

[22] Filed: Jul. 30, 1999

Related U.S. Application Data

[63] Continuation of application No. 08/872,240, Jun. 10, 1997, Pat. No. 5,935,264.

[51] Int. Cl.[7] .................................................. G01R 31/28
[52] U.S. Cl. ............................................ 714/724; 714/738
[58] Field of Search ..................................... 714/724, 738, 714/741, 742, 811, 725, 726, 733, 734, 703, 15, 33, 35, 37, 38, 39, 47, 48, 49; 324/158.1; 702/119

[56] References Cited

U.S. PATENT DOCUMENTS

| | | | |
|---|---|---|---|
| 4,176,780 | 12/1979 | Sacher et al. | 714/736 |
| 5,381,417 | 1/1995 | Loopik et al. | 714/724 |
| 5,745,501 | 4/1998 | Garner et al. | 714/741 |
| 5,771,243 | 6/1998 | Lee et al. | 714/738 |
| 5,935,264 | 8/1999 | Nevill et al. | 714/724 |

*Primary Examiner*—Trinh L. Tu
*Attorney, Agent, or Firm*—Kirkpatrick & Lockhart LLP

[57] ABSTRACT

The present invention is directed to a system comprised of a computer, at least one integrated circuit tester, a communications link enabling communications between the integrated circuit tester and the computer, and a computer-readable medium. The computer-readable medium contains a sequence of instructions that, when executed, create a set of tests for integrated circuit testing. The set of tests may include only those tests that are calculated to be statistically significant. A second set of tests may be created that includes only those tests that are calculated to be statistically insignificant. The computer monitors the test results and moves tests between the two sets to ensure that only statistically significant tests are in the first group and that only statistically insignificant tests are in the second group.

34 Claims, 3 Drawing Sheets

METHOD AND APPARATUS FOR DETERMINING A SET OF TESTS FOR INTEGRATED CIRCUIT TESTING

CROSS REFERENCE TO RELATED APPLICATIONS

This is a continuation of U.S. patent application Ser. No. 08/872,240, filed on Jun. 10, 1997 now U.S. Pat. No. 5,935,264.

FEDERALLY SPONSORED RESEARCH (Not Applicable)

BACKGROUND OF THE INVENTION

1. Field of the Invention

The present invention is directed to the testing of integrated circuits, and more particularly, to the determination of a set of tests for testing integrated circuits.

2. Description of the Background

To ensure a high level of quality of semiconductor devices, a series of tests is performed on the integrated circuits that comprise the devices at various stages in their manufacture. The series of tests ensures that the integrated circuits conform to the performance specifications of the product line which the circuits comprise.

In the manufacture of semiconductor devices, integrated circuits are formed on wafers, which typically contain a number of integrated circuits. The functionality of the integrated circuits is then tested, or probed, while the circuits are still on the wafer. Each wafer is then cut into pieces, or dies, with a diamond saw. Each die represents one integrated circuit. A die that does not pass wafer testing is either discarded or reworked to restore the functionality of the circuits. Dies that pass wafer level testing are usually mounted on a lead frame and encapsulated with a plastic compound to form a semiconductor device. However, the die may be mounted and encapsulated at a later time, after further testing is performed on the die.

Electrical tests are then typically performed on each device. Following this initial testing, burn-in tests are usually performed on each of the devices. Burn-in testing involves testing the devices at high temperatures, usually exceeding 100 degrees Celsius, for a length of time typically exceeding 24 hours. The environmental stress applied to the devices during burn-in testing is much greater than the devices will typically encounter under normal operation. Therefore, burn-in testing identifies defects in the devices that may cause early semiconductor device failures.

Burn-in testing typically cannot test the devices at their maximum operating speeds and cannot perform other discrete tests on the devices. Thus, the devices typically undergo another series of electrical tests. This series of tests is commonly referred to as "final test."

During each of the testing phases, large numbers of electrical tests must be performed on a large number of integrated circuits on wafers or on a large number of packaged semiconductor devices via integrated circuit testers. Due to the large numbers, test times for a production run of a semiconductor device may be long and may thus increase manufacturing costs.

When a new integrated circuit type is introduced to production, it is not known which of these various electrical tests are required to ensure specification compliance. It is typical to run a large number of electrical tests for a period of time (or for a certain number of integrated circuits) to determine which electrical tests are critical. After the initial data are collected, the data are manually reviewed and a reduced set of electrical tests is implemented. This process continues for the life of a product.

A problem associated with the foregoing method is that the calculations must be made according to a large volume of pass/fail data received as a result of a large number of test runs. Thus, the manual calculations are complex and difficult to apply consistently throughout the testing of a product line. Also, the foregoing process of removing tests from the test set has the disadvantage that once a test is removed from the set of applied tests, it is difficult to determine if and when the test should be added back into the test set.

Thus, the need exists for a system and method of determining a set of tests for an integrated circuit. A need also exists for a system and method which performs statistical calculations according to test pass/fail data to determine a set of tests that must be delivered to integrated circuit testers and a system and method which delivers the set of tests to the testers. A need also exists for a system and method that dynamically removes statistically insignificant tests from the test set and adds statistically significant tests into the test set.

BRIEF SUMMARY OF THE INVENTION

The present invention, according to its broadest implementation, is directed to the determination of a set of tests for integrated circuit testing. The present invention provides an automated method and apparatus to create a reduced set of critical electrical tests and a set of non-critical electrical tests for quality control.

The method and apparatus creates a set of tests that does not include statistically insignificant tests. The method and apparatus may also create another set of tests that includes only statistically insignificant tests.

The present invention may also be part of a system for testing integrated circuits which comprises a processor, a communications link between the processor and at least one integrated circuit tester, and a memory which stores instructions to create a set of tests.

The present invention also contemplates a computer-readable medium that has instructions stored on it that create a set of tests for integrated circuit testing.

The present invention represents a substantial advance over prior methods and systems of testing integrated circuits. Because a test sequence is automatically produced and continually updated, the number of tests that must be executed by the integrated circuit testers may be greatly reduced. This reduction causes a corresponding reduction in test times. Also, because the test sequence is continually updated, the integrity of the product testing and a high level of quality assurance are maintained. Also, there is a reduction in manpower because the test sequence need not be determined manually at periodic intervals. Also, the present invention may be used at the wafer testing, burn-in testing, or final testing stages in the integrated circuit testing process. Those, and other advantages and benefits of the present invention will become apparent from the Description of the Preferred Embodiments hereinbelow.

BRIEF DESCRIPTION OF THE DRAWINGS

For the present invention to be clearly understood and readily practiced, the present invention will be described in conjunction with the following figures wherein.

DETAILED DESCRIPTION OF THE INVENTION

Figure 1:
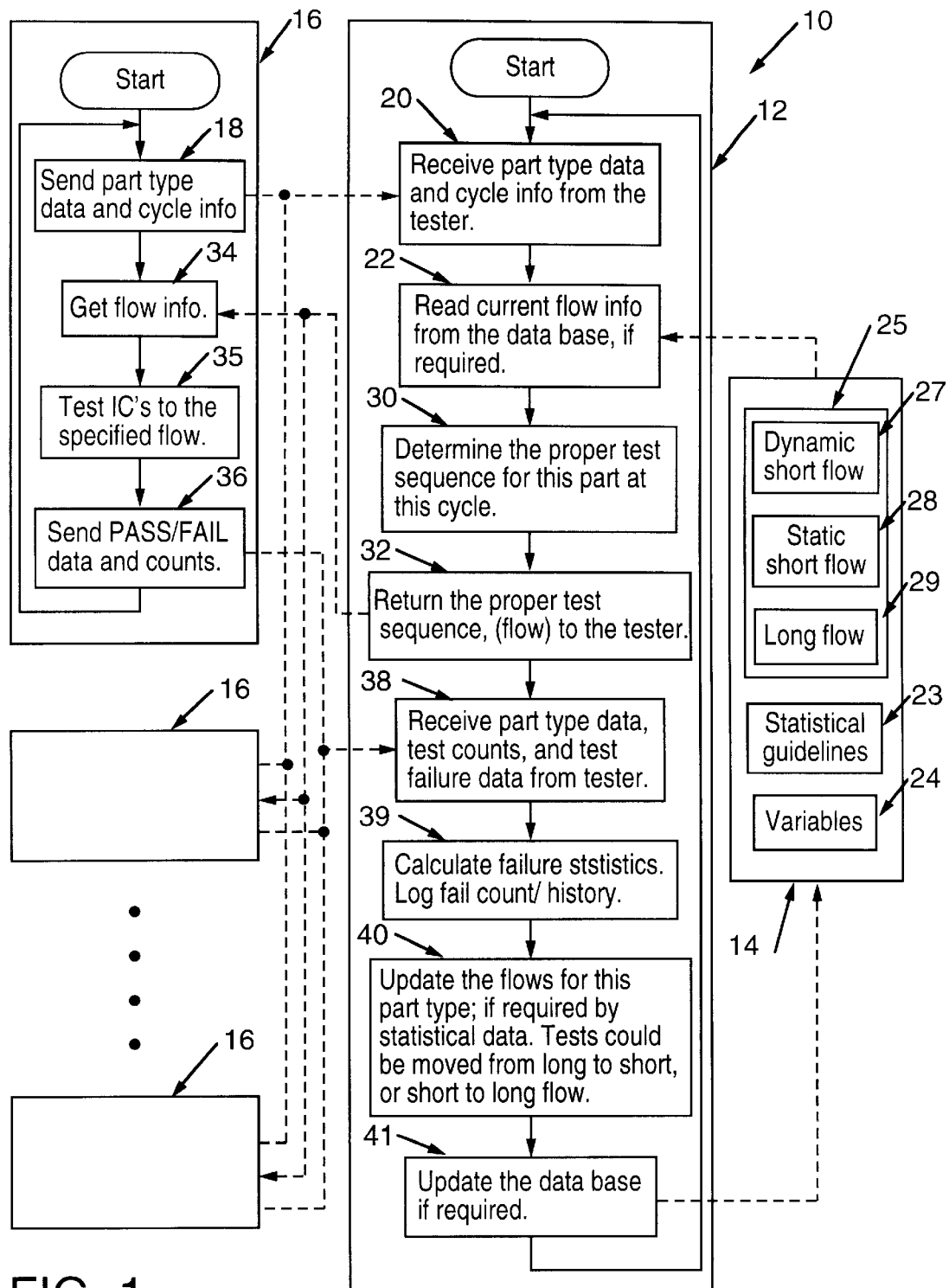
FIG. 1 is a block diagram of an integrated circuit test system constructed according to the present invention.

With reference to FIG. 1, there is shown an overview of an integrated circuit testing system 10 constructed according to the present invention for testing integrated circuits. Like reference numerals will be used among the various figures to denote like elements. In FIG. 1, solid lines represent the system flow and dashed lines represent the data flow of the system.

A flow control and statistical analysis function or module 12, which is comprised of multiple sequences of instructions, selects a set of tests from a database 14 and delivers the set to a tester, or testers 16. The operation of the integrated circuit testing system 10 will be hereinafter described with one tester 16 in communication with the flow control and statistical analysis module 12. However, as shown in FIG. 1, multiple testers 16 may be utilized in the integrated circuit testing system 10 depending on the number and variety of integrated circuits that must be tested using the integrated circuit testing system 10.

The tester 16 first broadcasts at step 18 its type, integrated circuit part type data, cycle information, and other pertinent data in the form of a query to the flow control and statistical analysis module 12. The flow control and statistical analysis module 12 receives the broadcast from the tester 16 at step 20. The flow control and statistical analysis module 12 then reads at step 22 statistical guidelines 23, variables 24, and test sets from flow data information 25, each of which are stored in the database 14. The statistical guidelines 23, the initial variables 24, and the initial flow data information 25 may be user-inputted guidelines or may be guidelines that are calculated by the flow control and statistical analysis module 12.

The flow data information 25 consists of a dynamic short flow 27, a static short flow 28, and a long flow 29 for each type of tester 16 that is in communication with the flow control and statistical analysis module 12. The static short flow 28 is a set of tests that is executed every time the test system 10 runs a test flow. Tests in the static short flow 28 include analog tests, such as parametric tests, that must be run for every integrated circuit. The dynamic short flow 27 is a set of tests that have been determined to be sufficiently statistically significant that they must be run every time the test system 10 runs a test flow. A statistically significant test is a test within a set of tests, which when evaluated using typical statistical methods, falls within a specified statistical guideline.

The long flow 29 is a set of tests that have been determined to be sufficiently statistically insignificant such that they are run only periodically, e.g., on a percentage-interval basis or on the first x% of each batch of parts. A statistically insignificant test is a test within a set of tests, which when evaluated using typical statistical methods, falls outside a specified statistical guideline. The percentage interval is determined by the results of testing an integrated circuit part type. The percentage interval can be a stored value contained in the variables 24. For example, a typical percentage interval could range from 0% to 100%. A percentage interval is a term describing an event happening a percentage of a time interval. The percentage interval is, in a preferred embodiment, dependent on a cyclical interval control to ensure an even distribution of tests. The long flow 29 may also be run on a certain percentage of integrated circuits in each batch of integrated circuits under test. For example, the first x% of integrated circuits in each batch could be tested with the long flow 29, where x represents a number between 1 and 100. The set of critical electrical tests are those tests in the dynamic short flow 27 and the static short flow 28. The set of noncritical electrical tests are those tests in the static long flow 29.

The flow control and statistical analysis module 12 determines, at step 30, on a percentage-interval basis, whether the dynamic short flow 27 and the static short flow 28 should be sent together as a test flow to the tester 16 or whether the dynamic short flow 27, the static short flow 28, and the long flow 29 should be sent together as a test flow to the tester 16. The flow control and statistical analysis module 12 then sends the proper test flow, which contains certain tests to be executed, to the tester 16 at step 32. Thus, the certain tests to be executed may be some of the tests or all of the tests from the flow data information 25.

The tester 16 receives the test flow at step 34 and tests the integrated circuits according to the test flow at step 35. The tester 16 then broadcasts or transmits at step 36 the results of the tests, the integrated circuit part type, the identify of the failed tests in the flow, the fail counts, the pass counts, and any other information designated by the user to the flow control and statistical analysis module 12. The flow control and statistical analysis module 12 receives the transmitted information at step 38 and calculates failure statistics at step 39 based on the results, the statistical guidelines 23, and the variables 24.

When the failure statistics are calculated at step 39, a fail count of each failing test is incremented and the fail history of each failing test is logged. Also, a total count of all tests used is incremented by the quantity of integrated circuits tested. The flow control and statistical analysis module 12 then creates a temporary update of the flow data information 25 at step 40. At step 40, if a failing test was in the long flow 29, it is moved to the dynamic short flow 27 if it is considered to be statistically significant. If the flow control and statistical analysis module 12 determines a test in the dynamic short flow 27 to be statistically insignificant, the test is moved from the dynamic short flow 27 to the long flow 29. Whether a test is classified as statistically insignificant depends on the statistical guidelines 23. The statistical guidelines 23 are formulated by the manufacturer of the integrated circuit. For example, a failure of a test in the static long flow 29, is statistically evaluated with all occurrences of that test contained within the database 14. If the result of the evaluation falls outside the statistical guidelines 23 contained in the database 14, the test is considered insignificant. Thus, a single failure of a test, with 100 elements of that test in the database (1 fail per 100 tests) when compared with a statistical guideline of 1 fail per 10 tests, would be deemed statistically insignificant. Conversely, if the result of the evaluation falls within the statistical guidelines 23 contained in the database 14, the test is considered significant. Thus, a single failure of a test, with 100 elements of that test in the database (1 fail per 100 tests) when compared with a statistical guideline of 1 fail per 1000 tests, would be deemed statistically significant.

The flow control and statistical analysis module 12 then updates the flow data information 25 at step 41 in the database 14 with the information contained in the temporary update of the flow data information 25, if the temporary update is different than the flow data information 25 that is stored in the database 14 (i.e. a test was moved from the long flow 29 to the dynamic short flow 27 or vice versa). The flow control and statistical analysis module 12 also updates the variables 24 at step 41, in the database 14 based on the results of the latest test run for a specific integrated circuit part type. The sequence in the flow control and statistical analysis module 12 is repeated until testing ceases for a particular integrated circuit part type.

Figure 2B:
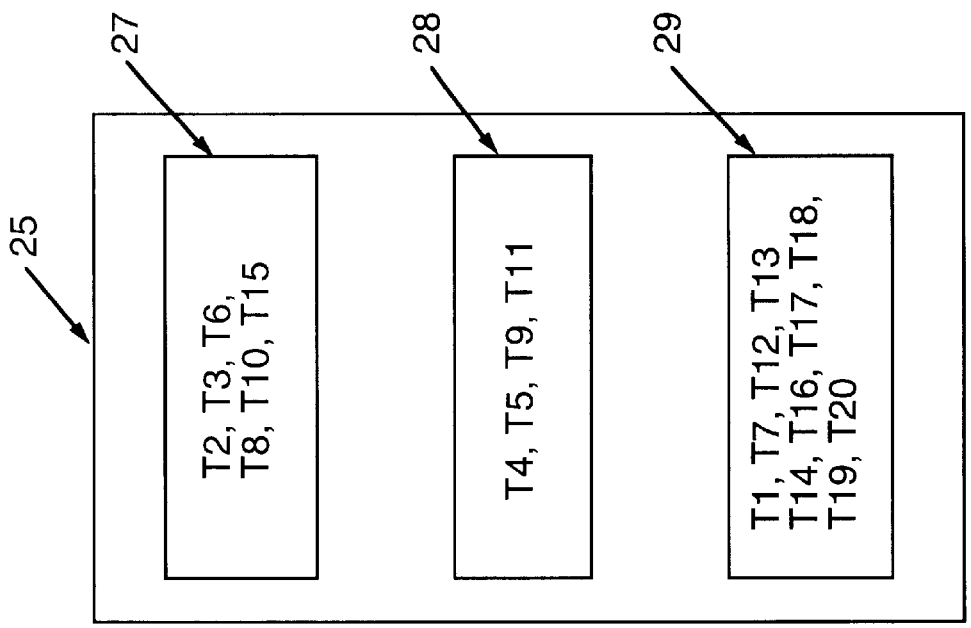
FIG. 2B illustrates an example of a test set that was created by a preferred embodiment of the present invention during integrated circuit testing.
Figure 2A:
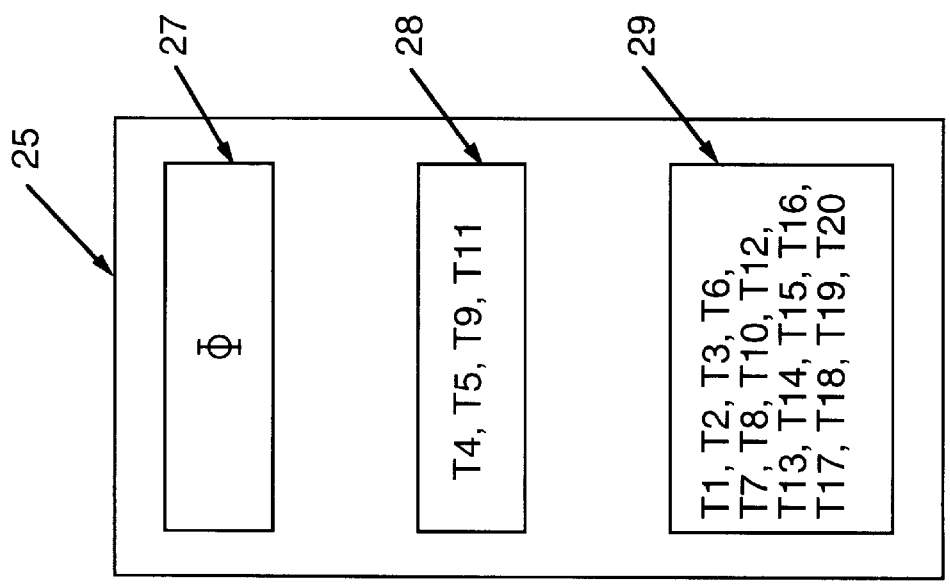
FIG. 2A illustrates an example of a set of tests that is typically input into an integrated circuit tester when a specific integrated circuit type is released for production.

FIGS. 2A and 2B illustrate an example of the flow data information 25 of the database 14. FIG. 2A shows the flow data information 25 when it is initially released to production for an integrated circuit part type at a certain time t=0. The flow data information 25 consists of 20 hypothetical tests labeled T1 through T20. The tests could be parametric tests or functionality tests, or a combination of parametric and functionality tests. In FIG. 2A, the static short flow 28 consists of a set of four critical tests, such as parametric tests, that must be run every time a test flow is run. The long flow 29 consists of the remainder of the tests, and the dynamic short flow 27 is an empty set.

FIG. 2B illustrates the flow data information 25 at a certain time $t=t_1$ after a number of test flow runs during production testing. The static short flow 28 does not change, and still consists of the same set of four critical tests as at time t=0. The dynamic short flow 27 now consists of a set of six tests that were determined to be statistically significant in detecting defects. These tests are executed every time a test flow is run. Thus, the static short flow 28 and the dynamic short flow 27 will eventually contain only the electrical tests required to ensure that the tested integrated circuits meet their performance specifications. The long flow 29 consists of a set of tests that were determined to be statistically insignificant in detecting defects. These tests may be executed on a percentage interval basis or on the first x% of each batch of parts as a monitor to further ensure that these tests remain statistically insignificant.

It is not necessary that the flow data information 25 be initialized exactly as portrayed in FIG. 2A. For example, the long flow 29 could be initialized at time t=0 with no tests and the dynamic short flow 27 could be initialized at time t=0 with all of the non-critical tests shown in the static short flow 28. Statistically insignificant tests would be moved from the dynamic short flow 27 to the long flow 29 and failing tests would remain in the dynamic short flow 27.

Figure 3:
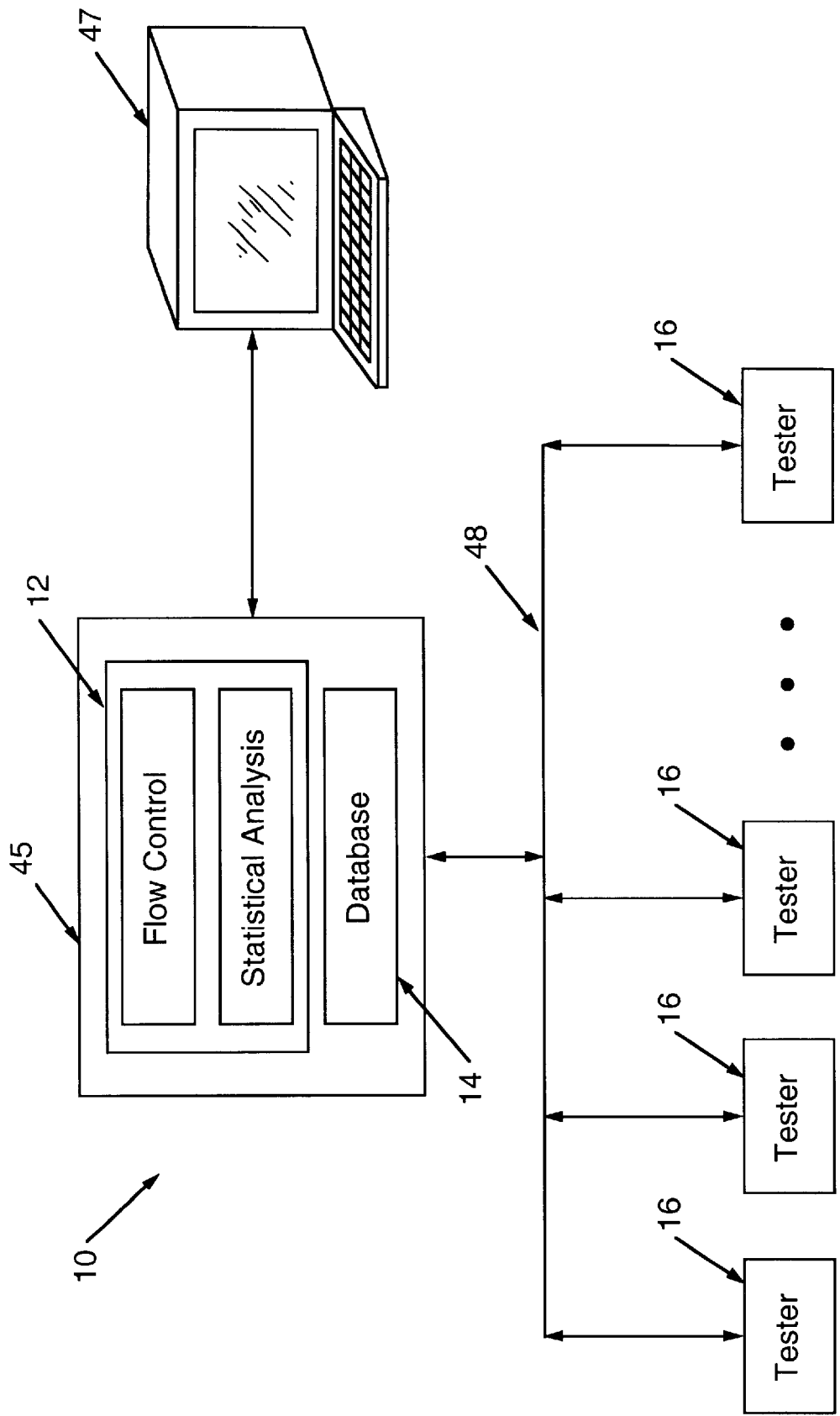
FIG. 3 illustrates a preferred embodiment of a hardware implementation of the present invention.

FIG. 3 illustrates a hardware block diagram of a preferred embodiment of the present invention. The flow control and statistical analysis module 12 and the database 14 are resident on a computer 45. A user terminal 47 provides input/output capabilities for interfacing with the computer 45. The computer 45 is connected through a communications network 48 to the testers 16. The communications network 48 communicates part type, data, and cycle queries to the computer 45. The communications network 48 communicates flow data information from the computer 45 to the testers 16. The testers 16 are conventional in structure and operation and supply power and input signals to the integrated circuits under test to verify proper functionality. The testers 16 record the pass/fail information for each part and the number of parts tested and sends the information via the communications network 48 to the computer 45.

The computer 45 may be a personal computer, a workstation, such as a Sun workstation configured as a file server, or a mainframe computer. The database 14 may also be resident on an external disk array that is in communication with the computer 45. The user terminal 47 can be either a personal computer or any other type of terminal that can accept input from a user, and display output to a user in response to the computer 45.

While the present invention has been described in conjunction with preferred embodiments thereof, many modifications and variations will be apparent to those of ordinary skill in the art. The foregoing description and the following claims are intended to cover all such modifications. and variations.

What is claimed is:

1. A computer implemented method for determining a set of tests for testing an integrated circuit, comprising the steps of:

identifying an initial set of tests;

performing certain of said tests in said initial set of tests on an integrated circuit;

analyzing the results from performing said certain of said tests to identify statistically insignificant tests; and removing said statistically insignificant tests from said initial set of tests to create an updated set of tests.

2. The method of claim 1 further comprising the step of placing said statistically insignificant tests into a second set of tests.

3. The method of claim 2 further comprising the steps of:

periodically performing certain of said tests in said second set of tests on an integrated circuit;

analyzing the results from performing said certain of said tests from said second set of tests to identify statistically significant tests; and placing said significant tests into said updated set of tests.

4. A method for optimizing a set of tests for testing an integrated circuit, comprising the steps of:

identifying a first set of tests;

performing certain of said tests in said first set on an integrated circuit;

analyzing the results from performing said certain of said tests in said first set to identify statistically insignificant tests;

removing said statistically insignificant tests from said first set of tests to a second set of tests;

periodically performing certain of said tests from said second set of tests on an integrated circuit;

analyzing the results from performing said certain of said tests in said second set to identify statistically significant tests; and removing said statistically significant tests from said second set of tests to said first set of tests.

5. A computer-implemented method for determining a set of tests for testing an integrated circuit, comprising the steps of:

reading an initial set of tests from a computer-readable medium;

performing certain of said tests in said initial set of tests on an integrated circuit;

analyzing the results from performing said certain of said tests; and updating, in response to said analyzing step, said computer-readable medium by removing statistically insignificant tests from said initial set of tests to create an updated set of tests.

6. The computer-implemented method of claim 5 further comprising the steps of:
   placing said statistically insignificant tests into a second set of tests; and
   writing said second set of tests to said computer-readable medium.

7. The computer-implemented method of claim 6 further comprising the steps of:
   periodically performing certain of said tests in said second set of tests on an integrated circuit;
   analyzing the results from performing said certain of said tests from said second set of tests; and
   updating, in response to said analyzing step, said computer-readable medium to move statistically significant tests from said second set of tests to said updated set of tests.

8. A computer-implemented method for determining a set of tests for testing integrated circuits and for controlling an integrated circuit tester, comprising the steps of:
   receiving information from an integrated circuit tester;
   reading a set of tests having a first subset and a second subset from a computer-readable medium;
   communicating certain of said set of tests to said integrated circuit tester;
   receiving a set of test results from said integrated circuit tester;
   calculating failure statistics based on said set of test results from said integrated circuit tester; and
   updating the computer-readable medium based on said failure statistics by moving from said first subset to said second subset any tests that are statistically insignificant and moving from said second subset to said first subset tests that are statistically significant.

9. The computer implemented method of claim 8 further comprising the steps of:
   reading a set of variables from said computer-readable medium;
   updating said variables based on said failure statistics; and
   writing said set of updated variables to said computer-readable medium.

10. An integrated circuit testing system, comprising:
    a first circuit for identifying an initial set of tests;
    a second circuit for performing certain of said tests in said initial set of tests on an integrated circuit;
    a third circuit for analyzing the results from performing said certain of said tests; and
    a fourth circuit for removing statistically insignificant tests from said initial set of tests to create an updated set of tests in response to said third circuit.

11. The integrated circuit testing system of claim 10 wherein said fourth circuit additionally moves said statistically insignificant tests into a second set of tests.

12. The integrated circuit testing system of claim 11 wherein said second circuit performs certain of said tests in said second set of tests on an integrated circuit periodically, and said third circuit additionally analyzing the results from performing said certain of said tests from said second set of tests, and said fourth circuit additionally moving statistically significant tests into said updated set of tests.

13. An integrated circuit testing system, comprising:
    a processor;
    at least one integrated circuit tester;
    a communications link enabling communications between said processor and said integrated circuit tester; and
    a memory, coupled to said processor, and storing a set of ordered data and a set of instructions which when executed by said processor cause said processor to perform the steps of:
    identifying an initial set of tests;
    instructing said integrated circuit tester to perform certain of said identified initial set of tests;
    analyzing the results from performing said certain of said identified initial set of tests to identify statistically insignificant tests; and
    updating said set of ordered data by removing said statistically insignificant tests from said initial set of tests to create an updated set of tests.

14. The integrated circuit testing system of claim 13 wherein said memory includes an additional set of instructions which when executed by said processor cause said processor to perform the additional step of placing said statistically insignificant tests into a second set of tests.

15. The integrated circuit testing system of claim 14 wherein said memory includes an additional set of instructions which when executed by said processor cause said processor to perform the additional steps of:
    periodically performing certain of said tests in said second set of tests on an integrated circuit;
    analyzing the results from performing said certain of said tests from said second set of tests to identify statistically significant tests; and
    placing said statistically significant tests into said updated set of tests.

16. A flow control and statistical analysis module for integrated circuit testing, comprising:
    a first sequence of instructions for receiving part data from an integrated circuit tester;
    a second sequence of instructions for reading a test set from a database;
    a third sequence of instructions for determining a test sequence;
    a fourth sequence of instructions for transmitting said test sequence to said integrated circuit tester;
    a fifth sequence of instructions for receiving test data from said integrated circuit tester;
    a sixth sequence of instructions responsive to said fifth sequence of instructions for calculating failure statistics;
    a seventh sequence of instructions responsive to said sixth sequence of instructions for updating said test set; and
    an eighth sequence of instruction responsive to said seventh sequence of instructions for writing said test set to said database.

17. A computer-readable medium having stored thereon instructions which, when executed by a processor, cause the processor to perform the steps of:
    identifying an initial set of tests;
    instructing an integrated circuit tester to perform certain of said identified initial set of tests;
    analyzing the results from performing said certain of said identified initial set of tests to identify statistically insignificant tests; and
    removing said statistically insignificant tests from said initial set of tests to create an updated set of tests.

18. The computer-readable medium of claim 17 having stored thereon additional instructions which, when executed by a processor, cause the processor to perform the additional step of placing said statistically insignificant tests into a second set of tests.

19. The computer-readable medium of claim 18 having stored thereon additional instructions which, when executed by a processor, cause the processor to perform the additional steps of:

periodically performing certain of said tests in said second set of tests on an integrated circuit;

analyzing the results from performing said certain of said tests from said second set of tests to identify statistically significant tests; and placing said statistically significant tests into said updated set of tests.

20. A computer-readable medium having stored thereon instructions which, when executed by a processor, cause the processor to perform the steps of:

receiving information from an integrated circuit tester;

reading a set of tests from a computer-readable medium;

transmitting certain of said set of tests to said integrated circuit tester;

receiving a set of test results from said integrated circuit tester;

calculating failure statistics based on said set of test results from said integrated circuit tester;

updating said set of tests; and writing said set of tests to said computer-readable medium.

21. A computer-implemented method for testing integrated circuits, comprising:

performing a first set of tests on a first set of the integrated circuits;

analyzing results from performing the first set of tests to identify statistically insignificant tests; and moving the statistically insignificant tests from the first set of tests to a second set of tests to create an updated first set of tests.

22. The method of claim 21, further comprising performing the updated first set of tests on a second set of the integrated circuits.

23. The method of claim 22, further comprising periodically performing the second set of tests on the second set of the integrated circuits.

24. The method of claim 23, further comprising:

analyzing results from performing the second set of tests on the second set of the integrated circuits to identify statistically significant tests; and moving the statistically significant tests from the second set of tests to the updated first set of tests.

25. A system for testing integrated circuits, comprising:

a processor;

an integrated circuit tester in communication with the processor; and a memory coupled to the processor and having stored thereon a set of instructions which when executed by the processor cause the processor to:

perform a first set of tests on a first set of the integrated circuits;

analyze results from performing the first set of tests to identify statistically insignificant tests; and move the statistically insignificant from the first set of tests to a second set of tests to create an updated first set of tests.

26. The system of claim 25, wherein the memory includes an additional set of instructions which when executed by the processor cause the processor to perform the updated first set of tests on a second set of the integrated circuits.

27. The system of claim 26, wherein the memory includes an additional set of instructions which when executed by the processor cause the processor to periodically perform the second set of tests on the second set of the integrated circuits.

28. The system of claim 27, wherein the memory includes an additional set of instructions which when executed by the processor cause the processor to:

analyze results from performing the second set of tests on the second set of the integrated circuits to identify statistically significant tests; and move the statistically significant tests from the second set of tests to the updated first set of tests.

29. A system for testing integrated circuits, comprising:

a first circuit for performing a first set of tests on a first set of the integrated circuits;

a second circuit for analyzing results from performing the first set of tests to identify statistically insignificant tests; and a third circuit for moving the statistically insignificant tests from the first set of tests to a second set of tests to created an updated first set of tests.

30. The system of claim 29, further comprising a fourth circuit for performing the updated first set of tests on a second set of the integrated circuits.

31. The system of claim 30, further comprising:

a fifth circuit for periodically performing the second set of tests on the second set of the integrated circuits;

a sixth circuit for analyzing results from performing the second set of tests on the second set of the integrated circuits to identify statistically significant tests; and a seventh circuit for moving the statistically significant tests from the second set of tests to the updated first set of tests.

32. A computer-readable medium having stored thereon instructions which when executed by a processor cause the processor to:

perform a first set of tests on a first set of integrated circuits;

analyze results from performing the first set of tests to identify statistically insignificant tests; and move the statistically insignificant tests from the first set of tests to a second set of tests to create an updated first set of tests.

33. The computer-readable medium of claim 32, having stored thereon additional instructions which when executed by a processor cause the processor to perform the updated first set of tests on a second set of integrated circuits.

34. The computer-readable medium of claim 33, having stored thereon additional instructions which when executed by a processor cause the processor to:

periodically perform the second set of tests on the second set of integrated circuits;

analyze results from performing the second set of test on the second set of integrated circuits to identify statistically significant tests; and move the statistically significant tests from the second set of tests to the updated first set of tests.

* * * * *

UNITED STATES PATENT AND TRADEMARK OFFICE
CERTIFICATE OF CORRECTION

PATENT NO. : 6,115,835

DATED : September 5, 2000

INVENTOR(S) : Nevill et al.

It is certified that error appears in the above-identified patent and that said Letters Patent is hereby corrected as shown below:

COLUMN 4

Line 28, delete "identify" and substitute therefor --identity--.

COLUMN 10

Line 26, delete "created" and substitute therefor --create--.

Line 59, delete "test" and substitute therefor --tests--.

Signed and Sealed this

Eighth Day of May, 2001

NICHOLAS P. GODICI

Attest:

Attesting Officer

Acting Director of the United States Patent and Trademark Office